United States Patent
Johnson

(10) Patent No.: US 8,865,596 B2
(45) Date of Patent: Oct. 21, 2014

(54) METHODS FOR FORMING SEMICONDUCTOR STRUCTURES USING SELECTIVELY-FORMED SIDEWALL SPACERS

(71) Applicant: Frank Scott Johnson, Wappinger Falls, NY (US)

(72) Inventor: Frank Scott Johnson, Wappinger Falls, NY (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/755,807

(22) Filed: Jan. 31, 2013

(65) Prior Publication Data
US 2013/0143409 A1 Jun. 6, 2013

Related U.S. Application Data

(62) Division of application No. 12/536,223, filed on Aug. 5, 2009, now Pat. No. 8,383,503.

(51) Int. Cl.
H01L 21/311 (2006.01)
H01L 21/308 (2006.01)
H01L 29/66 (2006.01)
H01L 21/84 (2006.01)

(52) U.S. Cl.
CPC ...... H01L 21/31111 (2013.01); H01L 21/3086 (2013.01); H01L 21/31116 (2013.01); H01L 29/66795 (2013.01); H01L 21/845 (2013.01)
USPC ............................ 438/696; 438/157; 438/595

(58) Field of Classification Search
CPC .............. H01L 21/845; H01L 21/3086; H01L 21/31111; H01L 21/31116; H01L 29/66795
USPC .......................................... 438/696, 157, 595
See application file for complete search history.

(56) References Cited

U.S. PATENT DOCUMENTS 7,585,734 B2 * 9/2009 Kang et al. ..................... 438/283
7,608,495 B1 * 10/2009 Gibbons ......................... 438/164
7,619,276 B2 * 11/2009 Zhu ................................ 257/316

OTHER PUBLICATIONS

U.S. Office Action mailed Jun. 27, 2012 in U.S. Appl. No. 12/536,223.
U.S. Office Action mailed Aug. 24, 2012 in U.S. Appl. No. 12/536,223.
Notice of Allowanced mailed Nov. 5, 2012 in U.S. Appl. No. 12/536,223.

* cited by examiner

*Primary Examiner* — Stephen W Smoot
*Assistant Examiner* — Vicki B Booker
(74) *Attorney, Agent, or Firm* — Ingrassia Fisher & Lorenz, P.C.

(57) ABSTRACT

Methods for forming semiconductor structures using selectively-formed sidewall spacers are provided. In one method, a first structure and a second structure is formed. The second structure has a height that is greater than the first structure's height. A first sidewall spacer-forming material is deposited overlying the first structure and the second structure. A second sidewall spacer-forming material is deposited overlying the first sidewall spacer-forming material. A composite spacer is formed about the second structure, the composite spacer comprising the first sidewall spacer-forming material and the second sidewall spacer-forming material. The second sidewall spacer-forming material is removed from the first structure and the first sidewall spacer-forming material is removed from the first structure.

7 Claims, 4 Drawing Sheets

-PRIOR ART-

METHODS FOR FORMING SEMICONDUCTOR STRUCTURES USING SELECTIVELY-FORMED SIDEWALL SPACERS

CROSS-REFERENCE TO RELATED APPLICATIONS

This application is a divisional application of U.S. patent application Ser. No. 12/536,223 (issued as U.S. Pat. No. 8,383,503) filed on Aug. 5, 2009, the contents of which are herein incorporated by reference in their entirety.

FIELD OF THE INVENTION

The present invention generally relates to methods for fabricating semiconductor structures, and more particularly relates to methods for forming semiconductor structures using selectively-formed sidewall spacers.

BACKGROUND OF THE INVENTION

In contrast to traditional planar metal-oxide-semiconductor field-effect transistors (MOSFETs), which are fabricated using conventional lithographic fabrication methods, nonplanar FETs incorporate various vertical transistor structures. One such semiconductor structure is the "FinFET," which takes its name from the multiple thin silicon "fins" that are used to form the respective gate channels, and which are typically on the order of tens of nanometers in width.

More particularly, referring to the exemplary prior art non-planar FET structure shown in FIG. 1, a FinFET 100 generally includes two or more parallel silicon fin structures (or simply "fins") 104 and 106. These structures are typically formed using a silicon-on-insulator (SOI) substrate (not shown), with fins 104 and 106 extending between a common drain electrode and a common source electrode (not shown). A conductive gate structure 102 "wraps around" three sides of both fins 104 and 106, and is separated from the fins by a standard gate oxide layer 103. While FIG. 1 illustrates only one gate structure 102 wrapped around fins 104 and 106, two or more parallel gate structures can be wrapped around the fins.

Fins 104 and 106 may be suitably doped to produce source/drain regions, as is known in the art, such that a gate channel is formed within the near surface of the fins adjacent to gate oxide 103. Sidewall spacers typically are formed about the sidewalls of the gate structures for distancing the source/drain regions from the channel, as in planar FET formation. However, unlike typical planar FET formation, during FinFET formation, the sidewall spacer-forming material must be etched away from the vertical sidewalls of the fins. The vertical sidewalls of the fins are the equivalent of the source/drain regions of planar FETs and must be exposed so that source/drain junctions can be formed.

To remove the sidewall spacer-forming material from the fins, the etching of the sidewall spacer-forming material must continue past the normal end point of the etch, that is, an overetch must be performed, until the entire thickness of the spacers on the fin sidewalls has been etched away. However, this overetch can cause several difficulties. For example, to prevent the sidewall spacers from being etched from the sidewalls of the gate structures, the gate structures must be made tall relative to the fins so that the spacers about the gate structures have sufficient width to withstand the overetch. The taller the gate structures, however, the greater the capacitance between the gate structure and the source/drain regions. In addition, hard mask material can be removed from the gate structures during the overetch. The semiconductor substrate upon which the gate structures and fins are disposed also is exposed to the overetch, leading to undercutting of the fins and weakening of their mechanical support. Moreover, the sidewalls of the fins are exposed to the overetching, leading to roughening of and damage to the source/drain areas on the sidewalls of the fins.

Accordingly, it is desirable to provide methods for forming semiconductor structures using selectively-formed sidewalls spacers. In addition, it is desirable to provide methods for forming FinFET structures having spacers formed about gate structures of the FinFET structures but not the fins. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for forming a semiconductor structure using selectively-formed spacers are provided. In accordance with an exemplary embodiment of the present invention, a method comprises forming a first structure overlying a semiconductor substrate, wherein the first structure has a first height, and forming a second structure overlying the semiconductor substrate. The second structure has a second height that is greater than the first height. A first sidewall spacer-forming material is deposited overlying the first structure and the second structure. A second sidewall spacer-forming material is deposited overlying the first sidewall spacer-forming material. The second sidewall spacer-forming material has an etch rate when subjected to an etchant that is different from an etch rate of the first sidewall spacer-forming material when subjected to the same etchant. A composite spacer is formed about the second structure, the composite spacer comprising the first sidewall spacer-forming material and the second sidewall spacer-forming material. The second sidewall spacer-forming material is at least substantially removed from the first structure and the first sidewall spacer-forming material is at least substantially removed from the first structure.

In accordance with another exemplary embodiment, a method for forming a FinFET structure is provided. The method comprises forming a fin overlying a semiconductor substrate and forming a gate structure overlying the fin. The gate structure has a height as measured from the semiconductor substrate that is greater than a height of the fin. A first sidewall spacer-forming material is deposited overlying the gate structure and the fin. A second sidewall spacer-forming material is deposited overlying the first sidewall spacer-forming material. The second sidewall spacer-forming material has an etch rate when subjected to an etchant that is different from an etch rate of the first sidewall spacer-forming material when subjected to the same etchant. The second sidewall spacer-forming material and the first sidewall spacer-forming material are etched until a composite spacer is formed about the gate structure. The second sidewall spacer-forming material is at least substantially removed from the fin and the first sidewall spacer-forming material is at least substantially removed from the fin.

A method for forming a semiconductor structure is provided in accordance with a further exemplary embodiment. The method comprises depositing a first sidewall spacer-forming material overlying a first structure and a second structure disposed on a semiconductor structure, the first structure taller than the second structure. A second sidewall spacer-forming material is deposited overlying the first sidewall spacer-forming material. The second sidewall spacer-forming material is different from the first sidewall spacer-forming material. The first sidewall spacer-forming material and the second sidewall spacer-forming material are etched until a composite spacer comprising the first sidewall spacer-forming material and the second sidewall spacer-forming material is formed about the first structure and until the second sidewall spacer-forming material is at least substantially removed from the second structure. The first sidewall spacer-forming material is at least substantially removed from the first structure.

BRIEF DESCRIPTION OF THE DRAWINGS

The present invention will hereinafter be described in conjunction with the following drawing figures, wherein like numerals denote like elements, and wherein:

FIGS. 2-18 illustrate methods for fabricating a FinFET structure with selectively-formed spacers, in accordance with various exemplary embodiments of the present invention, wherein:

FIGS. 2-7 are cross-sectional views of the FinFET structure of FIGS. 2-18 taken along the same axis;

FIGS. 8-9 are cross-sectional views of the FinFET structure of FIG. 7 taken along the 8-8 axis;

FIG. 10 is a top view of the FinFET structure of FIG. 9;

FIG. 11 is a cross-sectional view of the FinFET structure of FIG. 10 taken along the 11-11 axis;

FIG. 12 is a cross-sectional view of the FinFET structure of FIG. 10 taken along the 12-12 axis;

FIG. 13 is a cross-sectional view of the FinFET structure of FIG. 11, taken along the same axis, after various method steps;

FIG. 14 is a cross-sectional view of the FinFET structure of FIG. 12, taken along the same axis, after various method steps;

FIG. 15 is a cross sectional view of the FinFET structure of FIG. 13, taken along the same axis, after various method steps;

FIG. 16 is a cross-sectional view of the FinFET structure of FIG. 14, taken along the same axis, after various method steps;

FIG. 17 is a cross sectional view of the FinFET structure of FIG. 15, taken along the same axis, after various method steps; and FIG. 18 is a cross sectional view of the FinFET structure of FIG. 16, taken along the same axis, after various method steps.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 2-18 illustrate methods for fabricating semiconductor structures having selectively-formed sidewall spacers, in accordance with exemplary embodiments of the present invention. The methods achieve the selective formation of sidewall spacers about sidewalls of tall structures leaving sidewalls about shorter structures exposed. The methods are able to achieve this selective formation without requiring the use of masks, which increases throughput and cost. In addition, the methods do not utilize overetching processes that can result in damage to the tall structures, the short structures, or the semiconductor substrate inbetween. While the methods can be used to selectively form sidewall spacers about any semiconductor structure having tall structures about which sidewall spacers are desired and short structures about which sidewall spacers are not desired, for convenience the methods will be described with reference to the formation of a FinFET structure having tall gate structures and shorter fin structures.

Figure 1:
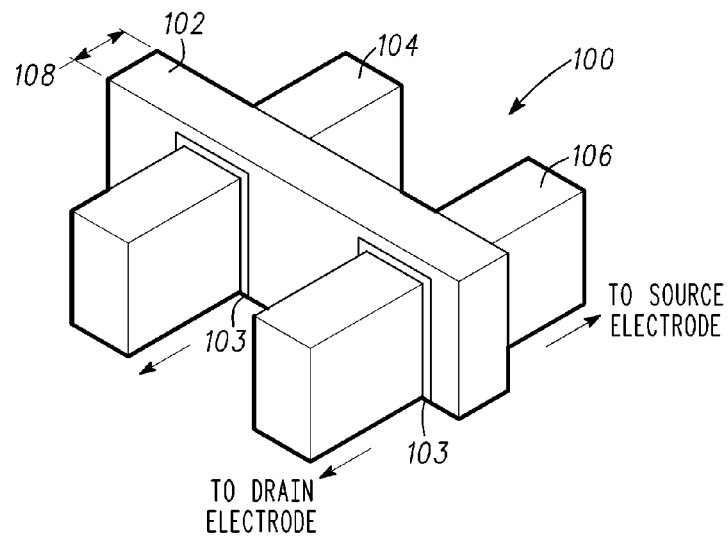
FIG. 1 is an isometric schematic view of a FinFET structure available in the prior art.
Figure 2:
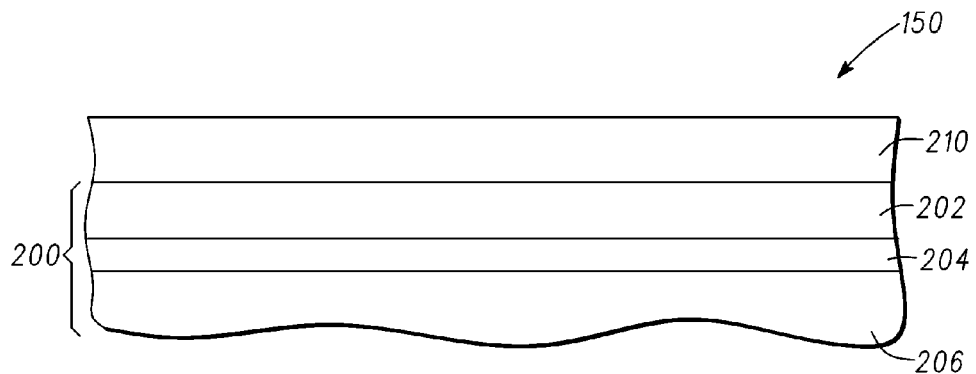

Referring to FIG. 2, in accordance with exemplary embodiments of the present invention, methods for fabricating a FinFET structure 150 include the step of providing a semiconductor substrate 200. As used herein, the term "semiconductor substrate" will be used to encompass semiconductor materials conventionally used in the semiconductor industry from which to make electrical devices. "Semiconductor materials" include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may comprise a silicon-comprising material 202 disposed on a silicon oxide material 204, commonly known as a silicon-on-insulator (SOI) structure that, in turn, is supported by a support substrate 206. The semiconductor substrate 200 may further comprise any other material layers overlying silicon-comprising material 202, such as insulator layers, mask layers, and the like. For example, in one exemplary embodiment, a hard mask layer (not shown), such as a silicon nitride layer, may be deposited overlying silicon-comprising material 202. A mandrel-forming material layer 210 is deposited on the semiconductor substrate 200. Examples of suitable materials for the mandrel-forming material layer 210 include, but are not limited to, photoresist, polycrystalline silicon, silicon oxide, silicon nitride, and the like.

Figure 3:
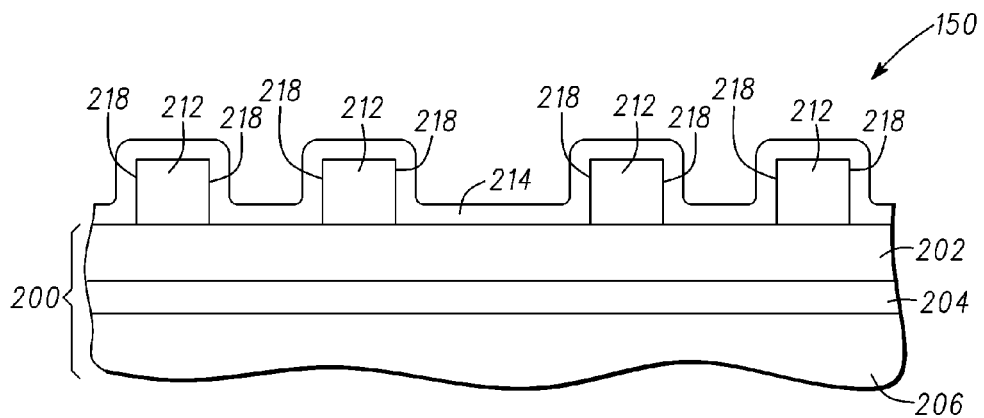

Referring to FIG. 3, after deposition of the mandrel-forming material layer 210, one or more patterned masks (not shown), such as one or more patterned photoresists, is formed on the mandrel-forming material layer 210, which then is etched to form a plurality of sacrificial mandrels 212, each having sidewalls 218. This etch may be performed by, for example, plasma or reactive ion etching (RIE) using chemistries based upon carbon trifluoride/oxygen ($CHF_3/O_2$) to etch silicon nitride, $CHF_3$ or carbon tetrafluoride ($CF_4$) to etch silicon oxynitride or silicon oxide, or $Cl^-$ or $HBr/O_2$ to etch polycrystalline silicon. Next, a sidewall spacer-forming layer 214 comprising a dielectric material such as, for example, silicon nitride or silicon oxide, is conformally blanket-deposited overlying the surface of semiconductor substrate 200 and sacrificial mandrels 212. Preferably, the composition of sidewall spacer-forming layer 214 is chosen such that sacrificial mandrels 212 may be selectively removed by a subsequent etch process without subjecting sidewall spacers formed from sidewall spacer-forming layer 214, discussed below, to further erosion. For example, if mandrel-forming material layer 210 is formed of silicon nitride, sidewall spacer-forming layer 214 may be formed of silicon oxide since sacrificial mandrels 212 may be selectively removed using a heated phosphoric acid/water ($H_3PO_4/H_2O$) solution. Sidewall spacer layer 214 has a thickness of from about 15 nm to about 40 nm. The actual thickness will depend, at least in part, on the desired critical dimension (CD) of the final fin structure, discussed below.

Figure 4:
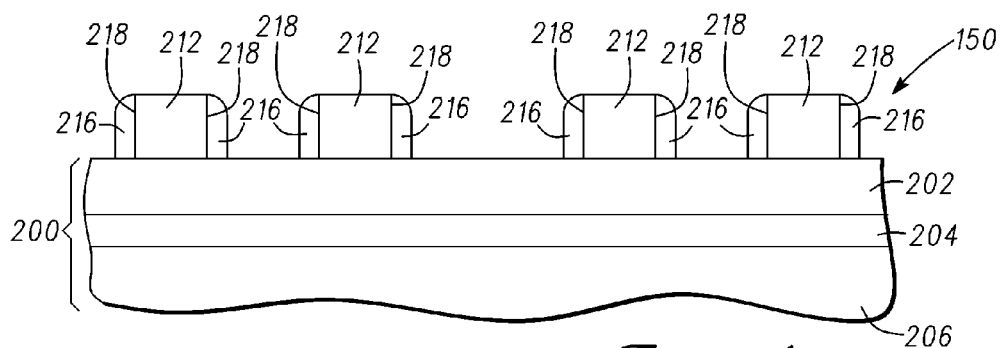
Figure 5:
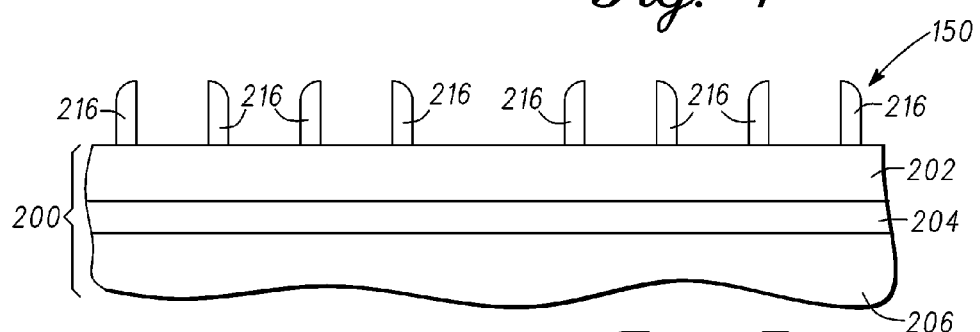
Figure 6:
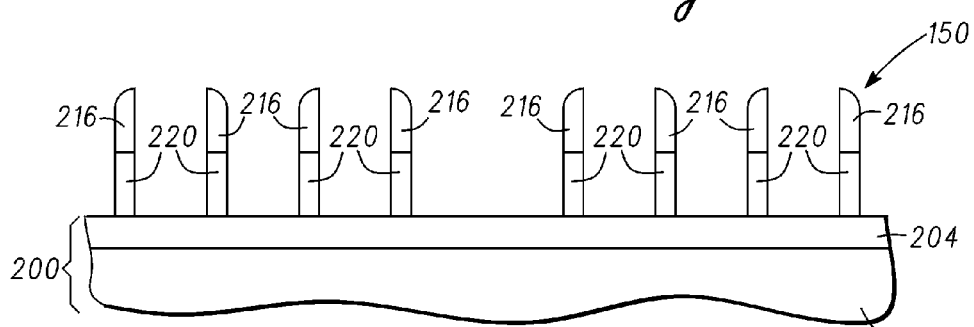

The method continues with the anisotropic etch of sidewall spacer-forming layer 214 to form sidewall spacers 216 adjacent to the sidewalls 218 of sacrificial mandrels 212, as illustrated in FIG. 4. This etch may be performed using the appropriate etch process described above. The sacrificial mandrels 212 then are removed, leaving the sidewall spacers 216 substantially intact, as illustrated in FIG. 5. After removal of sacrificial mandrels 212, silicon-comprising material 202 (and a hard mask if overlying silicon-comprising material 202) is etched using the sidewall spacers as an etch mask to form silicon-comprising fins 220, leaving semiconductor substrate 200 formed of buried oxide layer 204 and silicon substrate 206, as illustrated in FIG. 6. After etching of silicon-comprising material 202 (and/or after etching any overlying hard mask), sidewall spacers 216 may be removed using any suitable wet or dry etch process selective to spacers 216 to avoid erosion of fins 220. While the formation of eight fins is illustrated in FIG. 6, it will be appreciated that any number of fins suitable for a particular device application may be fabricated.

Figure 7:
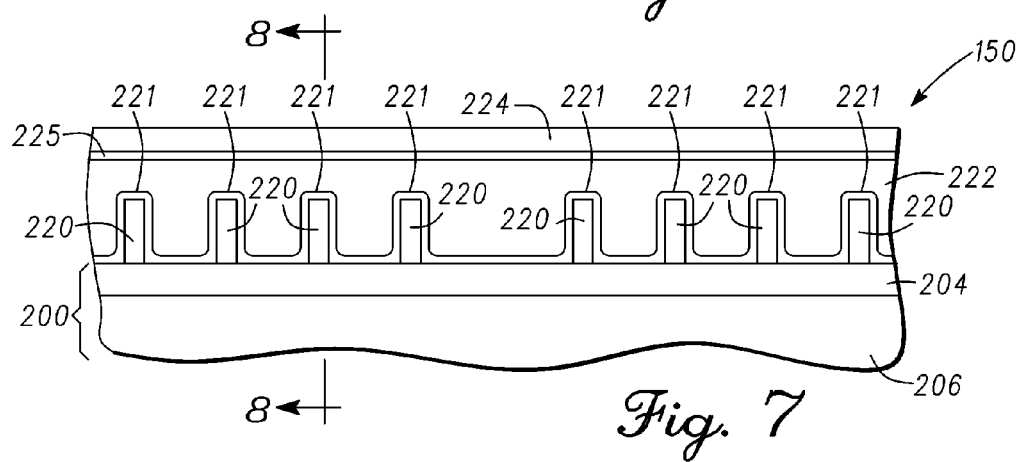
Figure 8:
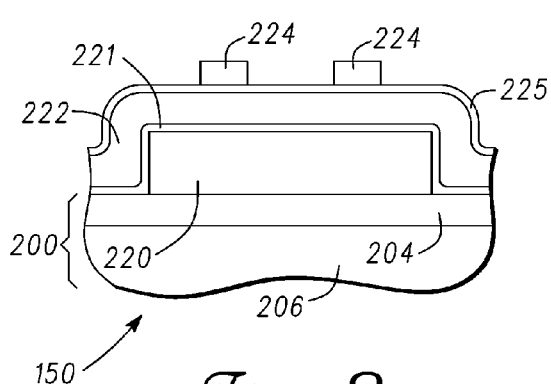

Referring to FIG. 7, in one exemplary embodiment, the method continues with the formation of a gate insulator 221 about the fins 220. The gate insulator 221 may be a thermally grown silicon dioxide formed by heating silicon fins 220 in an oxidizing ambient or, as illustrated, may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), and plasma enhanced chemical vapor deposition (PECVD). In another exemplary embodiment, a gate-forming material layer 222 then is deposited overlying the fins 220. The gate-forming material layer comprises a conductive material, such as, for example, polycrystalline silicon, one or more metals, a combination thereof, or the like, and has a thickness suitable for a desired device application. In one exemplary embodiment, the gate-forming material layer is capped with a mask 225 of, for example, silicon nitride. A mask 224, such as a photoresist, is deposited overlying gate-forming material layer 222 (and mask 225, if present) and is patterned via a photolithography process, as illustrated in FIG. 8. FIG. 8 is a cross-sectional view of the FinFET structure 150 of FIG. 7, taken along axis 8-8.

Figure 9:
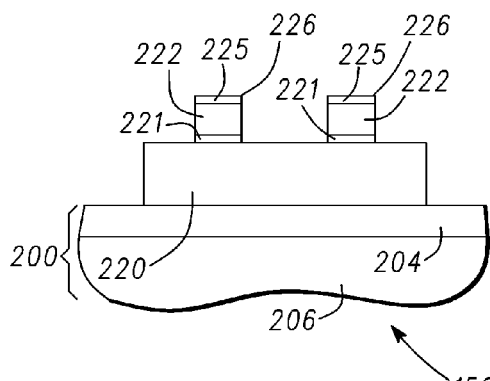
Figure 10:
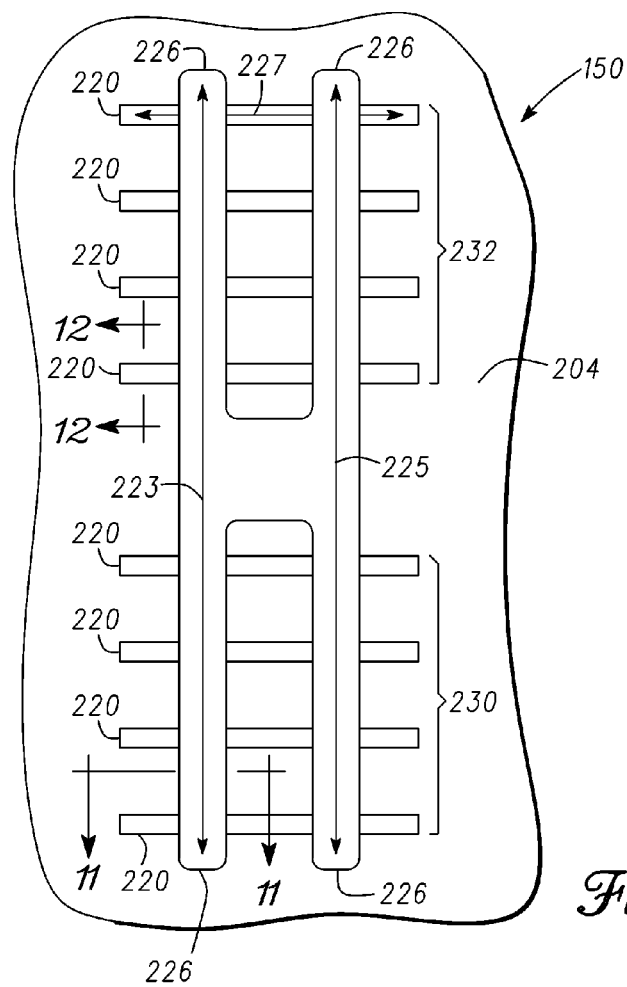
Figure 11:
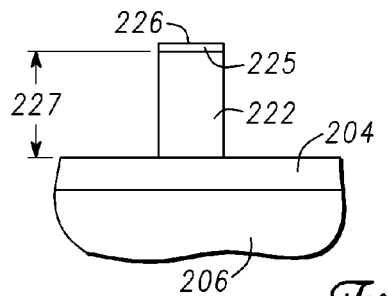
Figure 12:
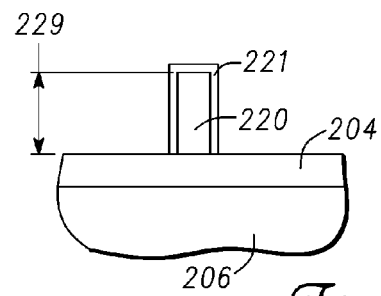

Next, gate-forming material layer 222 (and mask 225, if present) is etched to form gate structures 226 overlying fins 220 and the patterned mask 224 is removed, as illustrated in FIG. 9. Gate insulator 221 also may be etched using gate structures 226 as an etch mask. FIG. 10 is a top view of the FinFET structure 150 of FIG. 9. As illustrated in FIG. 10, FinFET structure 150 now comprises four gate structures 226. While four gate structures are illustrated in FIG. 10, it will be understood that FinFET structure 150 can have one or more gate structures disposed integrally and/or in parallel. A cross-sectional view of one of the gate structures 226 is illustrated in FIG. 11, which is taken along axis 11-11 of FIG. 10, and a cross-sectional view of one of the fins 220 is illustrated in FIG. 12, which is taken along axis 12-12 of FIG. 10. Referring to FIGS. 11 and 12, gate structure 226 has a height, indicated by double headed arrow 227, as measured from the substrate 200 that is greater than a height, indicated by double-headed arrow 229, of fin 220.

Figure 13:
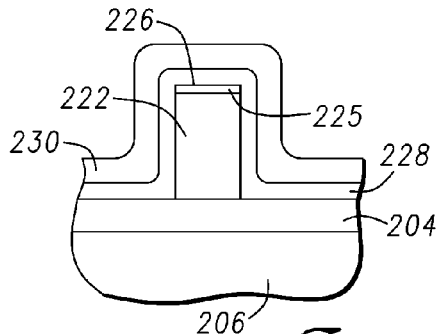
Figure 14:
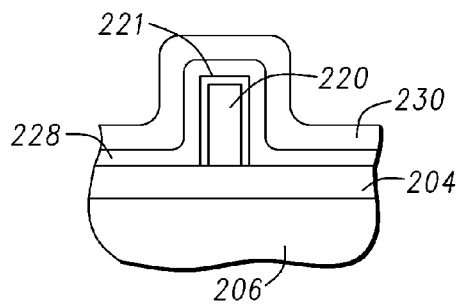

In accordance with an exemplary embodiment of the present invention, the method continues with the global deposition of a sidewall spacer-forming material 228 overlying gate structure 226 and fin 220, as illustrated in FIGS. 13 and 14. FIG. 13 is along the same axis as FIG. 11 and FIG. 14 is along the same axis as FIG. 12. Next, a sidewall spacer-forming material 230 is deposited overlying the sidewall spacer-forming material 228. The sidewall spacer-forming material 230 has an etch rate when subjected to an etchant that is different from an etch rate of the sidewall spacer-forming material 228 when subjected to the same etchant. For example, the sidewall spacer-forming material 228 may comprise a silicon nitride and the sidewall spacer-forming material 230 may comprise silicon oxide. When the gate structures and fins are disposed on such an oxide layer, if sidewall spacer-forming material 228 is an oxide, care must be taken during a subsequent wet etch, described in more detail below, not to etch through silicon oxide material 204. In another embodiment, such as when the gate structures and fins are not disposed on an oxide layer, such as an oxide of an SOI structure, the sidewall spacer-forming material 228 may comprise silicon oxide and the sidewall spacer-forming material 230 may comprise silicon nitride.

Figure 15:
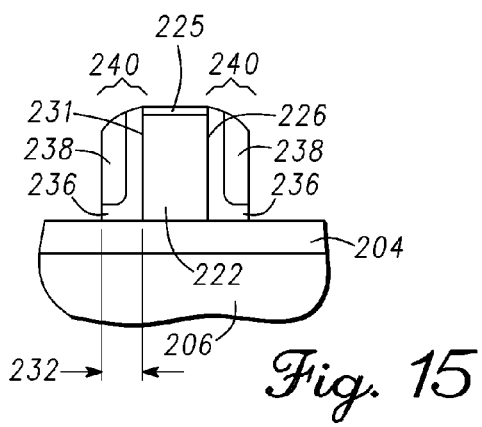
Figure 16:
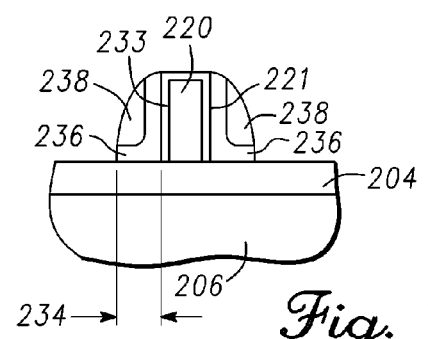

Referring to FIG. 15, the sidewall spacer-forming material 228 and the sidewall spacer-forming material 230 are subjected to an anisotropic etch, such as by, for example, reactive ion etching (RIE), to form composite spacers 240 comprising first sidewall spacers 236 and second sidewall spacers 238 about sidewalls 231 of the gate structure 226 and sidewalls 233 of fin 220, as illustrated in FIG. 16. In one exemplary embodiment, the etch is continued until second sidewall spacers 238 are at least substantially removed from fin 220 leaving first sidewall spacers 236 about sidewalls 233 of fin 220. As used herein, the term "at least substantially removed" means that a sufficient amount of material is removed so that it does not interfere with or adversely affect a subsequent method step and/or does not interfere with or adversely affect the operation of an element about which the material is disposed. Because gate structure 226 is taller than fin 220, the sidewall spacers formed about gate structure 226 have a base width, indicated by double-headed arrow 232, proximate to silicon oxide material 204 that is greater than a base width, indicated by double-headed arrow 234, of the sidewall spacers formed about fin 220. In this regard, and as discussed in more detail below, the sidewall spacers about gate structure 226 are able to withstand the etching that removes the narrower sidewall spacers formed about fin 220. In another exemplary embodiment (not shown), first sidewall spacers 236 and second sidewall spacers 238 are formed about the gate structure 226 and the fin 220 in a first etch, which is followed by a second etch that continues to etch second sidewall spacers 238 until at least substantially removed from fin 220.

Figure 17:
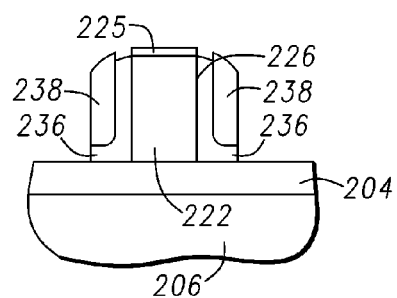
Figure 18:
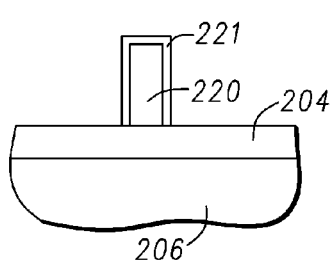

Next, the first sidewall spacers 236 about fin 220 are at least substantially removed from fin 220 using the remaining spacers 238 on gate structure 226 as an etch mask, as illustrated in FIG. 18. In one exemplary embodiment, the first sidewall spacers 236 are removed by a wet etch that can gently remove the spacers 236 without damage to buried oxide 204. For example, when first sidewall spacers 236 comprise silicon oxide, the first sidewall spacers 236 can be removed by a deglazing process using hydrofluoric acid. Alternatively, when the first sidewall spacers 236 comprise silicon nitride, the first sidewall spacers 236 can be removed by a hot phosphoric acid solution. In this manner, the first sidewall spacers 236 are removed from fin 220 while the first sidewall spacers 236 about gate structure 226 are protected by second sidewall spacers 238, as illustrated in FIG. 17. In addition, the first sidewall spacers 236 can be removed from fin 220 using an etchant that is selective to the material of the gate structure 226 so that the gate structure is not damaged during the second etch. In an alternative embodiment, mask 225 is formed of the same material as second sidewall spacers 238 so that, upon removal of first sidewall spacers 236, mask 225 protects the gate structure from the etchant.

Accordingly, methods for fabricating semiconductor structures having selectively-formed sidewall spacers have been provided. The methods achieve the selective formation of sidewall spacers about sidewalls of tall structures leaving sidewalls about shorter structures exposed. The methods are able to achieve this selective formation without requiring the use of masks, which increases throughput and cost. In addition, the methods do not utilize overetching processes that can result in damage to the tall structures, the short structures, or the semiconductor substrate inbetween.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a semiconductor structure, the method comprising the steps of:
    forming a first structure overlying a semiconductor substrate, wherein the first structure has a first height;
    forming a second structure overlying the semiconductor substrate, wherein the second structure has a second height and wherein the second height is greater than the first height;
    depositing a first sidewall spacer-forming material overlying the first structure and the second structure;
    depositing a second sidewall spacer-forming material overlying the first sidewall spacer-forming material, wherein the second sidewall spacer-forming material has an etch rate when subjected to an etchant that is different from an etch rate of the first sidewall spacer-forming material when subjected to the same etchant;
    etching the first sidewall spacer-forming material and the second sidewall spacer-forming material until a composite spacer is formed about the second structure, the composite spacer comprising the first sidewall spacer-forming material and the second sidewall spacer-forming material;
    at least substantially removing the second sidewall spacer-forming material from the first structure; and
    at least substantially removing the first sidewall spacer-forming material from the first structure,
    wherein the step of etching to form the composite spacer comprises forming about the second structure a composite spacer having a width that is greater than a width of a composite spacer formed about the first structure.

2. The method of claim 1, wherein the step of depositing a first sidewall spacer-forming material comprises depositing a silicon nitride and wherein the step of depositing a second sidewall spacer-forming material comprises depositing a silicon oxide.

3. The method of claim 2, wherein the step of at least substantially removing the first sidewall spacer-forming material from the first structure comprises exposing the first sidewall spacer-forming material to hot phosphoric acid.

4. The method of claim 1, wherein the step of depositing a first sidewall spacer-forming material comprises depositing a silicon oxide and wherein the step of depositing a second sidewall spacer-forming material comprises depositing a silicon nitride.

5. The method of claim 4, wherein the step of at least substantially removing the first sidewall spacer-forming material from the first structure comprises exposing the first sidewall spacer-forming material to hydrofluoric acid.

6. The method of claim 1, wherein the step of forming a composite spacer and the step of at least substantially removing the second sidewall spacer-forming material are performed during the same etch step.

7. The method of claim 1, wherein the step of forming a composite spacer and the step of at least substantially removing the second sidewall spacer-forming material from the first structure are performed during the same reactive ion etch step.

* * * * *